United States Patent [19]

Daikoku et al.

[11] Patent Number: 5,345,107
[45] Date of Patent: * Sep. 6, 1994

[54] COOLING APPARATUS FOR ELECTRONIC DEVICE

[75] Inventors: Takahiro Daikoku, Ushiku; Nobuo Kawasaki, Ibaraki; Noriyuki Ashiwake, Tsuchiura; Keizou Kawamura, Ibaraki; Shizuo Zushi; Mitsuo Miyamoto, both of Hadano; Atsushi Morihara, Katsuta, all of Japan

[73] Assignee: Hitachi, Ltd., Japan

[*] Notice: The portion of the term of this patent subsequent to Jun. 30, 2009 has been disclaimed.

[21] Appl. No.: 839,071

[22] Filed: Feb. 20, 1992

Related U.S. Application Data

[63] Continuation of Ser. No. 588,074, Sep. 25, 1990, abandoned.

[30] Foreign Application Priority Data

Sep. 25, 1989 [JP] Japan ................... 1-246314

[51] Int. Cl.$^5$ ............ F28F 7/00; H05K 7/20; H01L 23/00
[52] U.S. Cl. .................. 257/717; 257/712; 257/714; 257/718; 257/719; 257/720; 361/704; 165/185
[58] Field of Search ............ 351/81, 82; 357/81, 357/82, 74; 361/386; 165/185; 257/712, 714, 718, 719, 720

[56] References Cited

U.S. PATENT DOCUMENTS

| | | | |
|---|---|---|---|
| 4,567,505 | 1/1986 | Pease et al. | 351/81 |
| 4,607,277 | 8/1986 | Hassan et al. | 357/81 |
| 4,639,829 | 1/1987 | Ostegren et al. | 357/82 |
| 4,686,606 | 8/1987 | Yamada et al. | 357/81 |
| 4,761,518 | 8/1988 | Butt et al. | 174/52 FP |
| 4,908,695 | 3/1990 | Morihara et al. | 357/82 |
| 4,920,574 | 4/1990 | Yamamoto et al. | 357/82 |
| 4,922,376 | 5/1990 | Pommer et al. | 357/81 |
| 4,962,416 | 10/1990 | Jones et al. | 357/82 |
| 5,014,777 | 5/1991 | Sano | 357/81 |
| 5,109,317 | 4/1992 | Miyamoto et al. | 357/82 |
| 5,126,829 | 6/1992 | Daikoku et al. | 357/81 |

FOREIGN PATENT DOCUMENTS 58-218148 12/1983 Japan.
62-206867 9/1987 Japan.
63-169053 7/1988 Japan.

OTHER PUBLICATIONS

Japanese unexamined patent No. 62-268148.
IBM T.D.B., vol. 28, No. 7 (1985).
"Compliant Cold Plate Cooling Scheme", IBM TDB, vol. 21, No. 6, Nov. 1978, p. 2431.
Lynch et al, "Cooling Assembly for Integrated Circuit Chip", IBM TDB, vol. 20, No. 1, Jun. 1979, p. 143.

*Primary Examiner*—Viet Q. Nguyen
*Attorney, Agent, or Firm*—Evenson, McKeown, Edwards & Lenahan

[57] ABSTRACT

The present invention relates to a cooling apparatus for an electronic device, in which a cooling solid body in close contact through thermal conductive fluid with a heat transfer portion of the electronic device is provided, on its one surface in contact with the electronic device, with a number of grooves communicating with the outside of the heat transfer portion, and a spring member for elastically pressing this cooling solid body on the electronic device is provided for forcing the cooling solid body into close contact with the electronic device by means of the thermal conductive fluid in a third layer.

45 Claims, 15 Drawing Sheets

FIG. I

F I G. 2
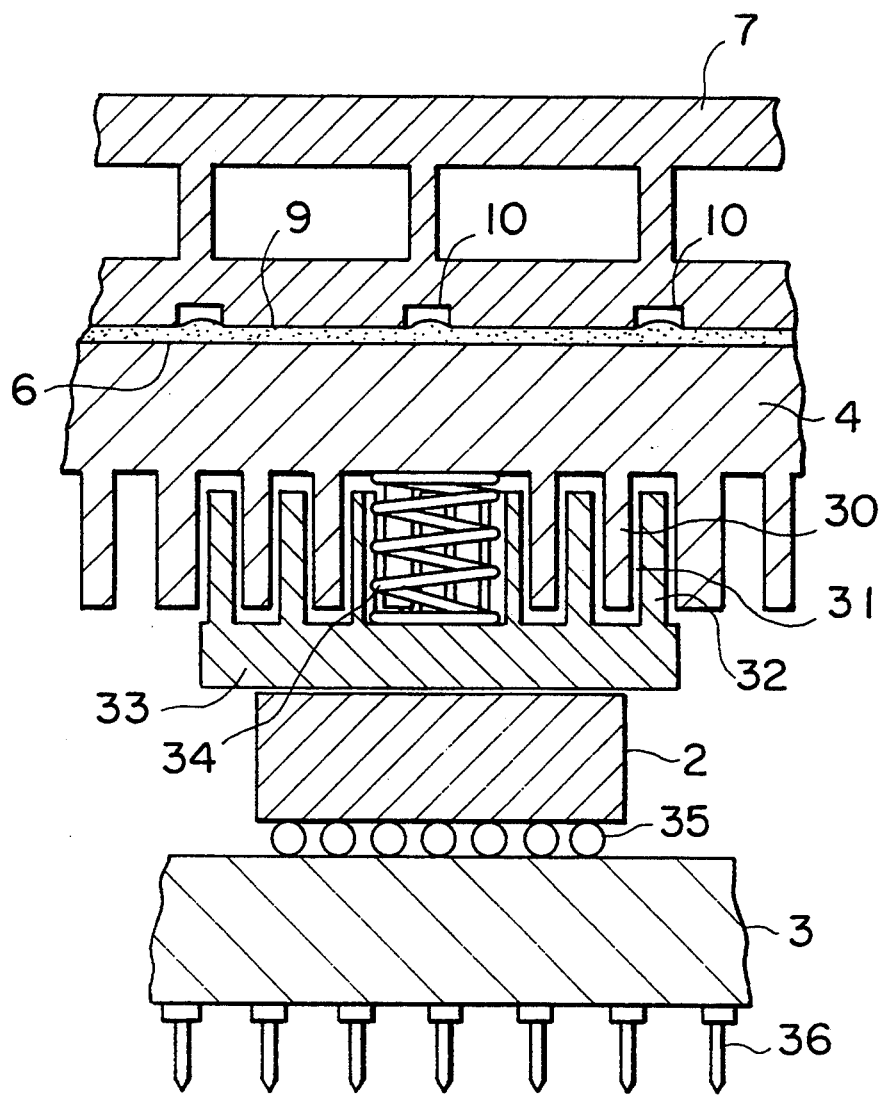

F I G. 17
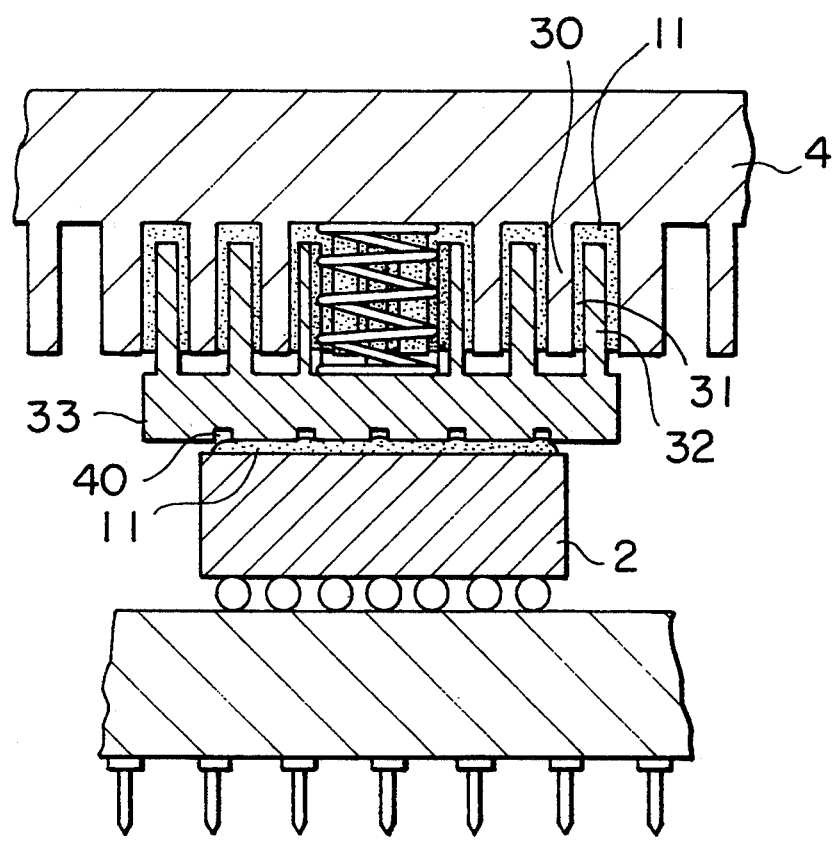

COOLING APPARATUS FOR ELECTRONIC DEVICE

This is a continuation application Ser. No. 07/588,074, filed Sep. 25, 1990, now abandoned.

CROSS-REFERENCE TO RELATED APPLICATION

This application is related to application Ser. No. 07/412,130 filed Sep. 25, 1989, in the name of T. Daikoku, et al. for COOLING APPARATUS FOR ELECTRONIC DEVICE, now U.S. Pat. No. 5,126,829.

BACKGROUND OF THE INVENTION

The present invention relates to a cooling apparatus of an electronic device e.g. a semiconductor chip, a chip module containing a single semiconductor chip and a multichip module containing multiple semiconductor chips.

Japanese Patent Application Laid-open No. 62-268148 etc. disclose a prior-art device for cooling a semiconductor chip by contact through a thermal conductive material with a cooling solid body.

U.S. Pat. No. 4,567,505 as illustrated in FIG. 1 discloses a prior-art arrangement in which a liquid e.g. silicon oil; readily wetting and spreading over the surface of a solid body is sandwiched between a heat transfer surface of a cooling solid body, which surface defines multiple microgrooves in the form of a so-called re-entrant structure with a narrower entrance and a divergent portion extending to the bottom of each of the microgrooves and a flat heat transfer surface of a semiconductor chip constituting a heating element, so that the surface tension of the liquid brings the two heat transfer surfaces into close contact with each other so as to reduce a contact thermal resistance therebetween.

The former publication fails to teach that the thickness of a layer of the thermal conductive material sandwiched between the semiconductor chip and the cooling solid body is reduced in order to increase the thermal conductance of the layer or to provide any suggestion of an electronic device in the form of a multichip module containing multiple semiconductor chips.

In the case of the cooling structure disclosed in U.S. Pat. No. 4,567,505, only the surface tension of the liquid draws the cooling solid body to the semiconductor device, so that when the heat transfer surface of either of the cooling solid body or the semiconductor device has a warp, a rigidness of the cooling solid body or the semiconductor device prevents any possibility of rectifying the warp by means of the draw force of the liquid and thus the thickness of the liquid layer between the two heat transfer surfaces cannot be maintained constant. That is, since there is no external force restraining a deformation in the heat transfer surfaces, the thickness of the liquid layer is changed due to the magnitude of the warp in the contacted heat transfer surfaces. Thus, the contact thermal resistance between the contacted heat transfer surfaces will not be kept constant.

On the other hand, when the cooling solid body which has been drawn to the semiconductor device is going to be separated from the semiconductor, the liquid is drawn to the entrance of the re-entrant groove and the radius of curvature of the concave surface of the liquid is much reduced as the cooling solid body separates from the semiconductor. Consequently, the pressure of the liquid decreases to below the surrounding pressure and the draw force of the liquid increases. Thereby, a required separation force must increase. If the separation force is reduced, then the draw force of the liquid will decrease, so that the contact thermal resistance will not be reduced. On the other hand, if the draw force of the liquid is increased, then the semiconductor device itself and/or an electric connection to the semiconductor device will experience damage when the cooling solid body is separated from the semiconductor device.

As described above, the prior art fails to teach that a bearing pressure between the contact surfaces is maintained low and a cooling power is concurrently increased, and a separation of the cooling solid body from an object to be cooled concurrently is easy.

SUMMARY OF THE INVENTION

A primary object of the present invention is to provide a cooling apparatus of an electronic device for following up a displacement by heat of a heat transfer surface and thereby improving its thermal conductivity so as to efficiently cool the electronic device.

Another object of the present invention is to provide an efficient cooling apparatus of a multichip module type electronic device containing multiple semiconductor chips even if a heat transfer surface is displaced by heat.

A further object of the present invention is to provide a cooling apparatus for an electronic device in which a uniformly thin layer made of a thermal conductive fluid is always sandwiched between the electronic device and a cooling solid body, even if a heat transfer surface is displaced by heat.

A still further object of the present invention is to provide a cooling apparatus for an electronic device in which a uniformly thin layer made of a thermal conductive grease is always sandwiched between the electronic device and the cooling solid body without applying a high pressure to the electronic device.

A further object of the present invention is to provide a cooling apparatus for an electronic device in which manufacturing, assembly and disassembly of the apparatus are easy and which apparatus has a good cooling power.

A still further object of the present invention is to provide a cooling apparatus for an electronic device in which while bearing pressure between the electronic device and the cooling solid body is maintained low, a cooling power is increased and the cooling solid body can be easily separated from the electronic device.

A further object of the present invention is to provide a cooling apparatus for an electronic device which includes grooves having a function to retain therein the thermal conductive grease through which the electronic device and the cooling solid body are brought into contact with each other so that the thermal conductive grease may not swell to the outside of contact surfaces of the electronic device and the cooling solid body.

A still further object of the present invention is to provide a cooling apparatus for an electronic device in which the cooling solid body can be pressed on the electronic device in order to always sandwich the thermal conductive grease uniformly, thinly and stably between the electronic device and the cooling solid body.

In order to achieve the above objects, the first aspect to the present invention comprises: an electronic device; a cooling solid body for eliminating heat produced by the electronic device; thermal conductive fluid having high thermal conductivity sandwiched between a heat transfer surface of the electronic device and a heat transfer surface of the cooling solid body; pressurizing means for forcing the cooling solid body into close contact with the electronic device, and a number of grooves which are formed on either heat transfer surface of the electronic device or cooling solid body and which are communicated with the outside of the heat transfer surface, the pressurizing means being comprising an elastic member for pressing the cooling solid body on the electronic device.

The second aspect of the present invention is characterized in that a cooling apparatus for an electronic device has an arrangement in which a spring forces a cooling solid body into close contact with a heat transfer surface of the electronic device to which surface a thermal conductive fluid with a high thermal conductivity and hardly wetting the surface of a solid is applied, for the purpose of cooling the electronic device, and that one of the heat transfer surfaces of the electronic device and the cooling solid body is flat and the other is a groove surface including a flat heat transfer surface and multiple grooves defined on the flat heat transfer surface and communicating with the outside of the grooved heat transfer surface, and the capacity of the grooves is larger than the volume of the thermal conductive fluid applied to between adjacent ones of the grooves.

The third aspect of the present invention is characterized in that a cooling apparatus for the electronic device comprises: a cooling solid body in close contact through thermal conductive fluid having high thermal conductivity with a heat transfer surface of an electronic device; and multiple grooves formed on either heat transfer surface of the electronic device and the cooling solid body and communicating with the outside of the heat transfer surfaces, the capacity of the grooves is larger than the volume of thermal conductive fluid sandwiched between the heat transfer surfaces so that the grooves leaves therein space communicating with the outside when the thermal conductive fluid is received within the grooves, and an elastic member is provided for closely pressing the cooling solid body on the electronic device.

The fourth aspect of the present invention is characterized in that a cooling apparatus for the electronic device comprises: an electronic device to be cooled; thermal conductive fluid provided on a heat transfer portion of the electronic device; a cooling solid body in close contact through the thermal conductive fluid with the heat transfer portion of the electronic device, the cooling solid body having at the close contact portion multiple grooves communicating with the outside of the cooling solid body; and a spring member for pressing the cooling solid body on the electronic device.

The fifth aspect of the present invention is characterized in that a cooling apparatus for the electronic device comprises: an electronic device of which a package contains a plurality of semiconductor chips; a cooling solid body for eliminating heat produced by the electronic device; a thermal conductive fluid with a high thermal conductivity sandwiched between the overall heat transfer surface of the electronic device and a heat transfer surface of the cooling solid body; spring means for elastically pressing to force the cooling solid body into close contact with the electronic device.

The sixth aspect of the present invention is characterized in that a cooling apparatus for an electronic device comprises: a multichip module in which a ceramic package hermetically seals a ceramic multilayer interconnection substrate with multiple LSI chips packaged thereon and flexible thermal conductive contactors transmit heat produced by the LSI chips to the ceramic package; a water-cooled jacket in close contact through thermal conductive fluid having high thermal conductivity and viscosity with the overall surface of a heat transfer portion of the multichip module, water passing through the interior of the water-cooled jacket; and means for elastically pressing to force the water-cooled jacket into close contact with the multichip module in order to sandwich a thin layer made of the thermal conductive fluid between the water-cooled jacket and the multichip module.

The seventh aspect of the present invention is characterized in that a cooling apparatus for an electronic device comprises: a multichip module in which a package seals a ceramic multilayer interconnection substrate with multiple LSI chips or microchip carriers packaged thereon and flexible thermal conductive contactors transmit heat produced by the LSI chips to the package; a number of grooves communicating with outside which are provided on contact surfaces of the flexible thermal conductive contactors in contact with the LSI chips or microchip carriers; high thermal conductive fluid sandwiched between the contact surfaces; and an elastic member for bringing the contactors into close contact with the heat transfer surface of the LSI chips or microchip carriers.

The eighth aspect of the present invention is characterized in that a cooling apparatus for an electronic device comprises high thermal conductive fluid sandwiched further between sliding contact surfaces inside the flexible thermal conductive contactors.

The other aspects, objects and advantages of the present invention will be apparent from the following description with reference to the drawings.

BRIEF DESCRIPTION OF THE DRAWINGS

FIG. 2 is an enlarged detailed sectional view of an essential portion of a flexible thermal conductive contactor in FIG. 1;

FIGS. 14, 17 and 18 are enlarged detailed sectional views of essential portions of other embodiments according to the invention, respectively;

DESCRIPTION OF THE PREFERRED EMBODIMENTS

Figure 1:
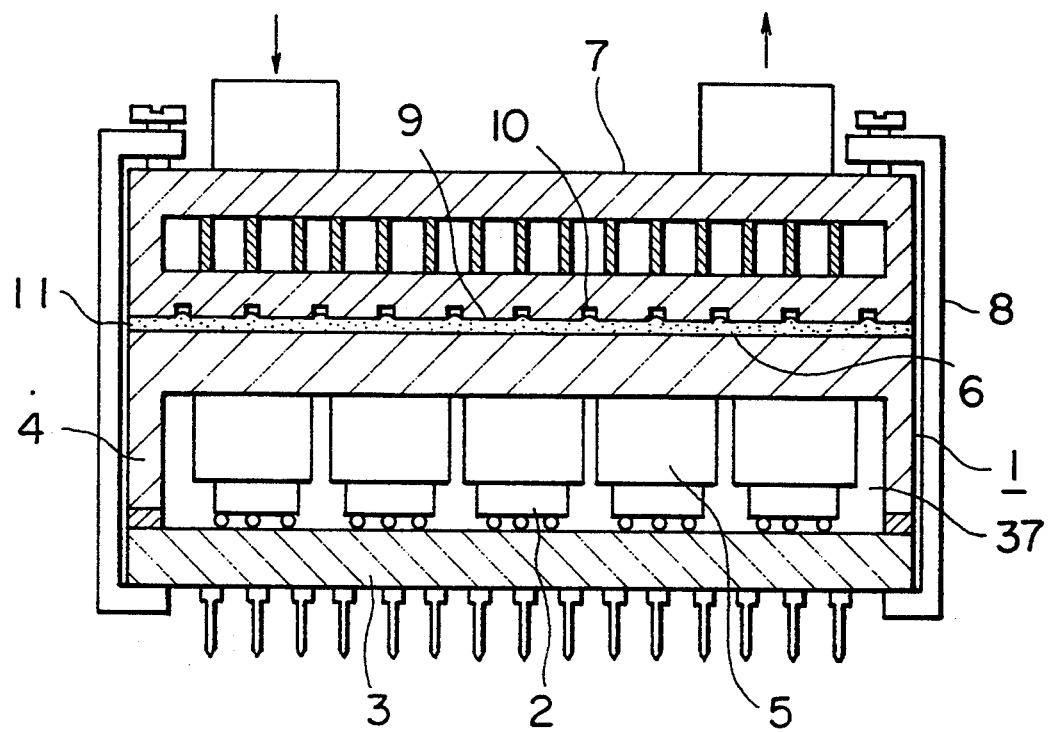
FIG. 1 is a vertical sectional view of a cooling apparatus for an electronic device showing one embodiment according to the present invention.

It is advantageous to a cooling apparatus for an electronic device that between the electronic device and a cooling solid body is sandwiched a thermal conductive grease and a possible air layer is eliminated therebetween in order to improve the thermal conductance between the electronic device and the cooling solid body. In order to further improve the cooling power of the cooling apparatus for the electronic device, fine particles of zinc oxide or high thermal conductive ceramic material are preferably mixed with the thermal conductive grease so as to increase the thermal conductivity of the resulting mixture, and high pressure produced in the manner of fastening with a bolt and the like preferably clamps the electronic device and the cooling solid body so that a layer of the thermal conductive grease spreads as thinly as possible and bubbles will not remain in the layer of the thermal conductive grease.

If the layer made of the thermal conductive grease and sandwiched between two flat heat transfer surfaces is to be made thin in order to reduce contact heat resistance therebetween, then a great bearing pressure must be applied to the heat transfer surfaces. In particular, when the areas of the heat transfer surfaces increase the distance for flowing an excessive thermal conductive grease out of the heat transfer surfaces increases, and a greater bearing pressure must be required. Since a high thermal conductive grease includes fine particles of a high thermal conductive material at a high density in order to increase the thermal conductivity thereof, the high thermal conductive grease has a very great coefficient of viscosity and is able to wet the surface of a solid only with difficulty. Therefore, a great bearing pressure must be applied to the heat transfer surfaces sandwiching the high thermal conductive grease therebetween so as not to leave bubbles in the high thermal conductive grease and to produce a uniformly thin layer of the high thermal conductive grease. Thus, since in the case of an electronic device e.g. a semiconductor chip made of a silicon crystal or semiconductor package made of alumina $Al_2O_3$, aluminum nitride AlN or high thermal conductive silicon carbide SiC, the mechanical strength of each of these materials is much lower than that of a metal and the mechanical strength of an electric connection provided on such electronic device is low, an application of large bearing pressure may damage the electronic device. Bolting the cooling solid body through a female screw defined in the semiconductor package locally causes a high stress in a surrounding portion near the female screw, which may break down the electronic device.

On the other hand, when the electronic device which has been mounted to the cooling solid body fails, the cooling solid body must be separated from the electronic device. However, when these two solid bodies which have been once brought into close contact with each other will be separated from each other, the thermal conductive grease will not be easily divided. A large force of separating the cooling solid body from the electronic device will damage the electronic device itself, a mount and support therefor or an electric connection to the electronic device. In view of preventing the damage, it is neither possible to reduce the thickness of the layer of the thermal conductive grease nor to increase the heat transfer surfaces.

Further, when the thermal conductive grease is only applied to the electronic device or the cooling solid body and the electronic device and the cooling solid body are brought into contact with each other then to be pressurized, and excess of the thermal conductive grease swells out from between the contact surfaces of the electronic device and the cooling solid body. Therefore, in order to prevent the thermal conductive grease from swelling out, the contact surfaces of the electronic device and the cooling solid body must be accurate enough not to be warped and the bearing pressure between the contact surfaces and the coating amount of the thermal conductive grease are required to be controlled strictly.

Therefore, the present invention has an arrangement in which the high thermal conductive fluid which is able to wet the surface of a solid only with difficulty is applied to one of two flat heat transfer surfaces of the electronic device and the cooling solid body, the other heat transfer surface having multiple grooves communicating with the outside of the other heat transfer surface, and the capacity of the grooves is so large as to leave space communicating with the outside of the other heat transfer surface even when the high thermal conductive fluid applied to a portion of the other heat transfer surface defined between adjacent grooves is pushed into the adjacent grooves.

Thus, one of the two flat heat transfer surfaces of the electronic device and the cooling solid body defines the multiple grooves, so that the portion of the one heat transfer surface defined between the adjacent grooves has a narrow width. When a heat transfer surface with a groove pitch l is in close contact with and pressed on a heat transfer surface having a layer of a high thermal conductive fluid with an initial application thickness δ, the internal pressure of the high thermal conductive fluid is boosted and the high thermal conductive fluid flows into the grooves. In this state, the contact surfaces of the layer of the high thermal conductive fluid receive shearing force $\tau_W$ so that bearing pressure W between the heat transfer surfaces flowing the high thermal conductive fluid is expressed by the following inequality:

$$W > \tau_W \cdot \frac{l}{\delta} \tag{1}$$

As can be understood from the inequality (1), as the groove pitch l is reduced, the bearing pressure W can be reduced. Since the capacity of the grooves is so large that each of the grooves leaves therein space communicating with the outside of the grooves when the high thermal conductive fluid applied to a portion of the heat transfer surface defined between adjacent grooves is pushed into the adjacent grooves, a division operation caused by each of the grooves will not be blocked. In addition, as the high thermal conductive fluid is pushed out into the grooves, bubbles included in the layer of the high thermal conductive fluid are entrained into the grooves and escape out of the grooves. Thus, the low bearing pressure W can allow the layer of the high thermal conductive fluid between the opposite heat transfer surfaces to be thin, so that the contact thermal resistance between the electronic device and cooling solid body can be maintained low and stable.

Further, because the capacity of the grooves is larger than the applying amount of the thermal conductive fluid, even if the fluid which has been applied to the contact surface is pushed out into the grooves, the flow of the fluid is stopped at the grooves because of its characteristic of wetting and spreading over the surface of a solid only with a difficulty, thereby preventing the fluid from swelling out of the grooves.

On the other hand, when the electronic device is separated from the cooling solid body, the high thermal conductive fluid is drawn out of the grooves. Generally, since the high thermal conductive fluid e.g. the high thermal conductive grease or a high thermal conductive adhesive is able to wet and spread over the surface of a solid only with difficulty, the contact angle of the high thermal conductive fluid exceeds 90° and a gas-liquid interface of the high thermal conductive fluid which has been pushed into the grooves defines a convex surface. The pressure $P_1$ of the high thermal conductive fluid in the grooves which provides the convex interface is higher by $\sigma/r$, where a represents the surface tension of the high heat conductive fluid and r represents the radius of curvature of the convex interface, than the pressure Pa of a surrounding air. Thus, since the pressure of the in-groove high thermal conductive fluid is higher than the pressure of the surrounding air, the in-groove high thermal conductive fluid flows out of the grooves into space between the opposite heat transfer surfaces as the heat transfer surfaces separate from each other. Concurrently, the gas-liquid interface of the high thermal conductive fluid begins to deform and air enters the layer of the high thermal conductive fluid. Once air has entered the layer, the layer, which has the narrow width between the adjacent grooves, is readily divided. As the number of the defined grooves increases, the lengths of fluid interfaces in contact with the surfaces of the grooves, i.e., the so-called lengths of wetted perimeter, greatly increase. Thus, the probability of the occurrence of breaking the fluid interfaces is high. In addition, the contact area of the grooved heat transfer surface is small, so that a required separation force is small.

As described above, the electronic device is mounted to the cooling solid body and a continuously stable and low contact thermal resistance is secured under a small load which will damage neither the electronic device nor a connection to the electronic device. On the other hand, a small force can separate the electronic device and the cooling solid body from each other. Therefore, assembly, disassembly and maintenance of the assembly of the electronic device are easy.

Hereinafter, the embodiments of the present invention will be described in detail with reference to the drawings.

FIG. 1 illustrates the overall arrangement of a multichip module to which the present invention is applied. The multichip module 1 is so arranged that a ceramic package 4 hermetically seals and packages a ceramic multilayer interconnection substrate 3 with multiple microchip carriers 2 each containing LSI chips.

Figure 3:
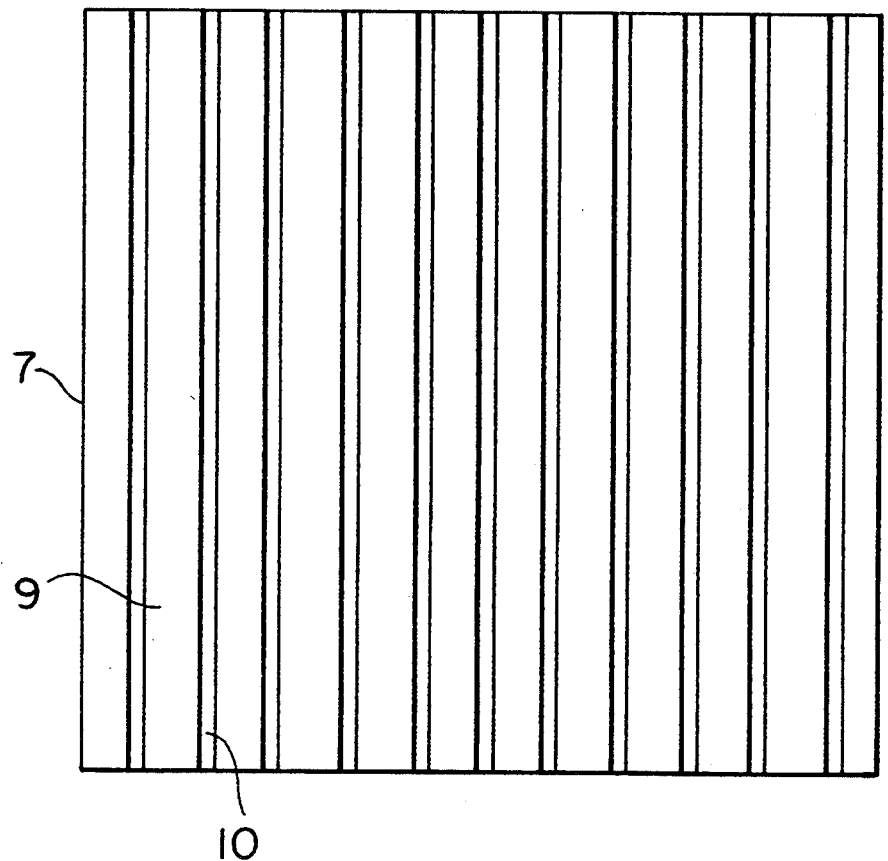
FIG. 3 is a bottom view of a water-cooled jacket in FIG. 1.

Heat produced by each LSI chip is transmitted through a flexible thermal conductive contactor 5 pressed on the back surface of each microchip carrier 2 to the ceramic package 4. As shown in FIG. 2, the flexible thermal conductive contactor 5 comprises; a number of flat fins 30 extending from an inner surface of the package 4; a solid thermal conductor 33 provided on each microchip carrier 2 and having fins 32 each fitting with corresponding fins 30 on the package 4 with microgaps 31; and a spring 34 pressing the solid thermal conductor 33 onto the microchip carrier 2. The microchip carrier 2 is facedown bonded through soldering microballs 35 to the top surface of the multilayer interconnection substrate 3 with alternating multiple conductive layers and insulating layers. The microchip carrier 2 is electrically connected to multiple pins 36 provided on the underside of the multilayer interconnection substrate 3. On the other hand, a water-cooled jacket (i.e. cooling solid body) 7 having an interior space through which a low-temperature cooling water passes is mounted by means of a metal clamp 8 to a cooled surface 6 of the ceramic package 4. As shown in FIG. 3, a heat transfer surface 9 of the water-cooled jacket 7 has multiple grooves 10 each communicating with the outside of the heat transfer surface 9. The cooled surface 6 of the package 4 and the heat transfer surface 9 of the water-cooled jacket 7 sandwich a layer of a high thermal conductive grease 11. Helium gas fills sealed space 37 defined between the multilayer interconnection substrate 3 and the package 4. Heat produced by the LSI chips is transmitted to the solid heat conductor 33 in contact with the microchip carrier 2 and in turn through the fins 32 of the solid thermal conductor 33 and layers made of helium gas in the microgaps 31 to the fins 30 provided on the package 4.

Heat received by the package 4 is transmitted from the heat transfer surface 6 thereof through the layer of the high thermal conductive grease 11 to the heat transfer surface 9 of the water-cooled jacket 7 and finally run away by a cooling water.

Figure 4A:
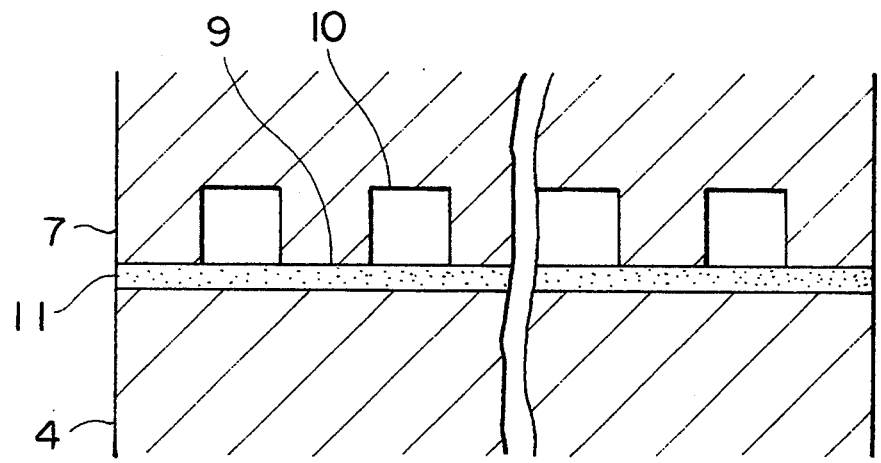
FIG. 4A is a sectional view of a conduction of forcing the water-cooled jacket into close contact with the electronic device with a high thermal conductive grease sandwiched therebetween in FIG. 1.
Figure 4B:
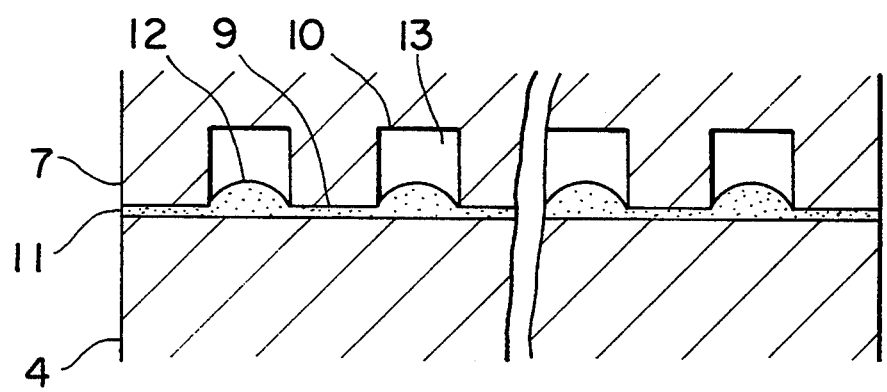
FIG. 4B is a sectional view of a condition of clamping the water-cooled jacket and the electronic device with the high thermal conductive grease sandwiched therebetween in FIG. 1.
Figure 4C:
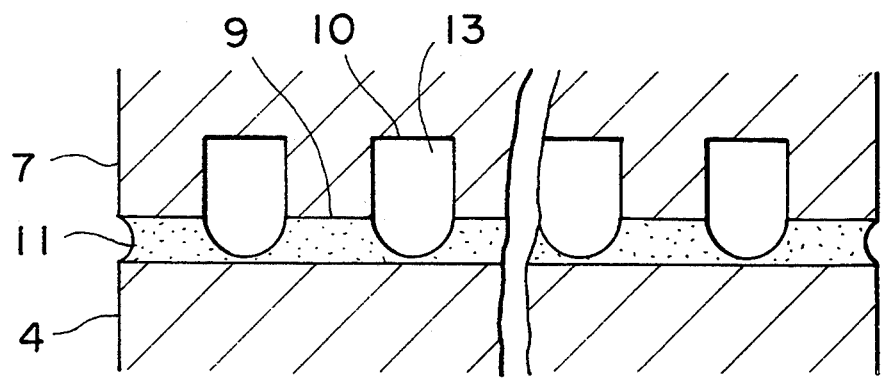
FIG. 4C is a sectional view of a condition of separating the water-cooled jacket from the electronic device with the high thermal conductive grease sandwiched therebetween in FIG. 1.

FIG. 4A illustrates a condition in which the high thermal conductive grease 11 is uniformly applied to the heat transfer surface 6 of the package 4 of the multichip module 1 and then the heat transfer surface 9 with the multiple grooves 10 of the water-cooled jacket 7 is simply in close contact with the layer of the high thermal conductive grease 11. FIG. 4B illustrates a condition in which then, the package 4 and the water-cooled jacket are compressed. FIG. 4C illustrates a condition in which the water-cooled jacket 7 is being separated from the package 4. In the condition of FIG. 4A, portions of the heat transfer surface 9 of the water-cooled jacket 7 except the grooves 10 are in contact with the surface of the layer of the high thermal conductive grease 11 essentially uniformly applied to the heat transfer surface 6 of the package 4. As shown in FIG. 4B, as the metal clamp 8 begins to press the water-cooled jacket 7 to the package 4 in FIG. 4A, heat transfer surface portions between adjacent grooves 10 enter the layer of the high thermal conductive grease 11 so that the high thermal conductive grease 11 swells into the adjacent grooves 10 to define convex gas-liquid interfaces 12. Since the high thermal conductive grease 11 is able to wet and spread over the surface of a solid only with difficulty, the gas-liquid interface of the high thermal conductive grease 11 is convex. In this case, when the breadth between the adjacent grooves 10 is adequately narrow and some of the high thermal conductive grease 11 swelling into each groove 10 does not fill all of the groove 10 so as to leave space 13 in contact with the bottom of the groove 10 and communicating with the outside of the grooves 10, the layer of the high thermal conductive grease 11 sandwiched between the water-cooled jacket 7 and the package 4 is very thin even when a pressing force of the water-cooled jacket 7 is small. Even if when the heat transfer surface 9 of the water-cooled jacket 7 is made in contact with the layer of the high thermal conductive grease 11 bubbles are entrained into the layer of the high thermal conductive grease 11 or the high thermal conductive grease 11 poorly wets the heat transfer surface 9, the high thermal conductive grease 11 well wets the heat transfer surface 9 and the bubbles are able to easily escape out of the grooves 10 as the layer of the high thermal conductive grease 11 swells into the grooves 10. Thus, the contact thermal resistance between the water-cooled jacket 7 and the package 4 is maintained low and stable.

When the package 4 fails, or is maintained or checked, the water-cooled jacket 7 must be separated from the package 4. Also in this case, the provision of the grooves in the heat transfer surface allows a small force to separate the water-cooled jacket 7 from the package 4. That is, in the contact condition of FIG. 4B, the in-groove gas-liquid interface of the high thermal conductive grease 11 is convex so that the internal pressure of the high thermal conductive grease 11 is higher by $\sigma/r$, where $\sigma$ represents the surface tension of the high thermal conductive grease 11 and r represents the radius of curvature of the convex gas-liquid interface, than the pressure of an atmosphere surrounding the layer of the high thermal conductive grease 11. Therefore, as an external force begins to separate the water-cooled jacket 7 from the package 4, the in-groove high thermal conductive grease 11 easily begins to flow out of the grooves 10 into the gaps between the portions of the heat transfer surface 9 and the package 4. As shown in FIG. 4C, the in-groove high thermal conductive grease 11 is drawn out and each of the in-groove gas-liquid interfaces of the high thermal conductive grease 11 becomes concave. However, the high thermal conductive grease 11 is able to wet and spread over the surface of a solid only with difficulty, so that the gas-liquid interfaces of the high thermal conductive grease 11 which has been drawn out do not necessarily provide uniform surfaces but provide irregular surfaces. Air enters the layer of the high thermal conductive grease 11 through the irregular portions of the gas-liquid interfaces. Once air enters, the layer of the high thermal conductive grease 11 is easily separated since the groove pitch or breadth between adjacent grooves is narrow. In particular, as the number of the grooves 10 increases, the breadth between adjacent grooves 10 in which corresponding portions of the heat transfer surfaces 6 and 9 are in contact with each other is narrow and irregular wetting portions increase. Thus, the small force easily separates the water-cooled jacket 7 from the package 4 without damaging the package 4.

The water-cooled jacket of the above embodiment has the grooves. However, the package may alternatively have the grooves. A high thermal conductive adhesive also produces a similar operation and effect of the high thermal conductive grease.

Figure 5:
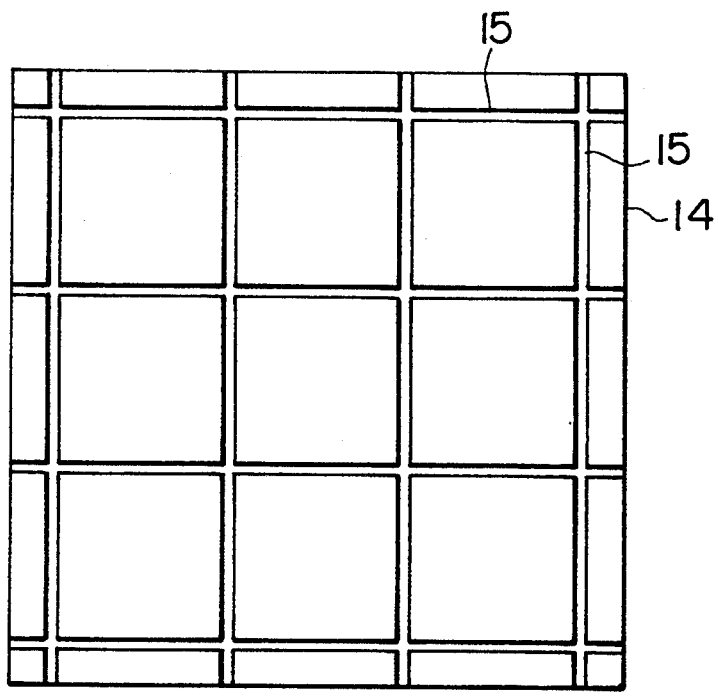
FIGS. 5, 6 and 7 are bottom views of other embodiments of the water-cooled jacket, respectively.

FIG. 5 illustrates an embodiment in which a heat transfer surface of a water-cooled jacket 14 defines grid-shaped grooves 15. In summary, the pattern of arranging the grooves 15 is optional whenever each of the grooves 15 communicates with the outside of the grooves 15.

Figure 6:
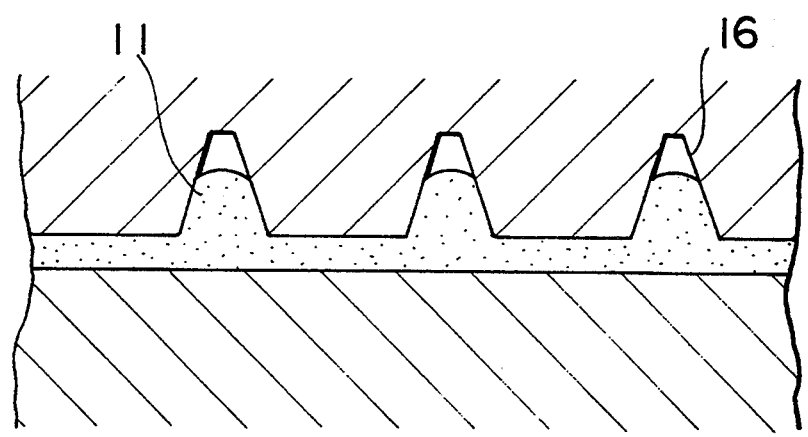

FIG. 6 illustrates an embodiment in which the cross-section of each of the grooves 16 in the heat transfer surface tapers to the narrow bottom of the groove 16. As the high thermal conductive grease 11 deeply enters the groove 16, the radius of curvature of a convex gas-liquid interface of the high thermal conductive grease 11 decreases, so that if the high thermal conductive grease 11 would excessively enter one groove 16, the internal pressure of a portion of the high thermal conductive grease 11 entering the one groove 16 would be higher than that of a portion of the high thermal conductive grease 11 entering an adjacent groove 16. Consequently, an excessive swelling of the high thermal conductive grease 11 into the one groove 16 is restrained, so that the tapering section of each of the grooves 16 has the function of automatically uniformly adjusting the volume of a portion of the high thermal conductive grease 11 entering each groove 16.

Figure 7:
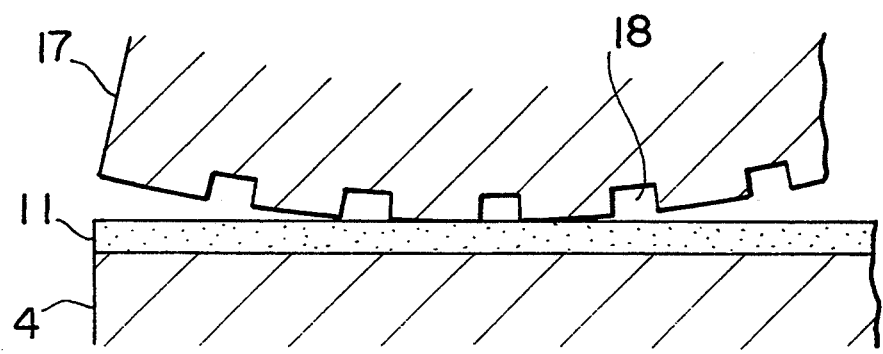

FIG. 7 illustrates an embodiment in which a spherical heat transfer surface, instead of the flat heat transfer surface, of a water-cooled jacket 17 defines multiple grooves 18. Thus, even if a heat transfer surface of a package opposite to the spherical heat transfer surface will be curved corresponding to the spherical heat transfer surface of the water-cooled jacket so as to be placed in close contact with a flat transfer surface of a water-cooled jacket only with difficulty, a clamping jig pressures a periphery of the spherical heat transfer surface of the water-cooled jacket 17 on the curved heat transfer surface of the package so that the opposite heat transfer surfaces are well in close contact with each other.

The following tests were carried out in order to confirm a pressing effect and a separation effect of the cooling apparatus in FIG. 1: Four kinds of copper water-cooled jackets were combined with a ceramic package having a flat surface. A water-cooled jacket A had a flat grooveless surface. A water-cooled jacket B had a surface with 13 grooves, each groove having a 1-mm width, a groove pitch being 6 mm. A water-cooled jacket C had a surface with 19 grooves, each groove having a 1-mm width, a groove pitch being 4 mm. A water-cooled jacket D had a surface with 51 grooves, each groove having a 0.5-mm width, a groove pitch being 1.5 mm. Each of the water-cooled jackets A to D was 100-mm square. Each of the grooves in the water-cooled jackets A to D was 0.5-mm deep. A layer of the high thermal conductive grease applied to the package was 20 $\mu$m to 100 $\mu$m thick.

Figure 8:
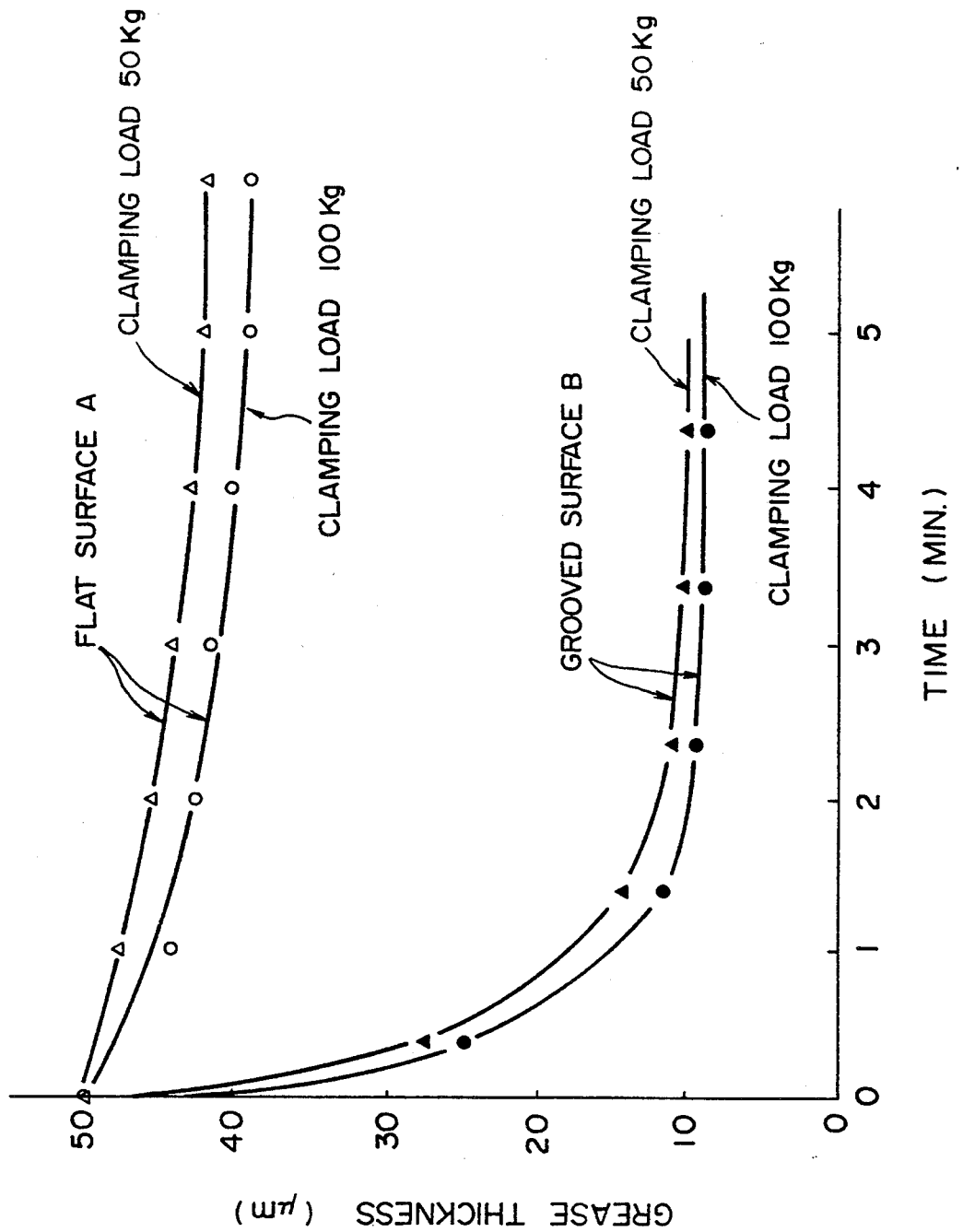
FIG. 8 is a diagram showing the results of pressing tests in the above-described cooling apparatus.

FIG. 8 illustrates data of changes in thickness in layers of the applied high thermal conductive grease caused with passage of time when the water-cooled jackets A and B are pressed through the layers of the applied high thermal conductive grease on an electronic device. The water-cooled jackets A and B were employed. The high thermal conductive grease were applied by means of a mask with a 50-$\mu$m thickness to the water-cooled jackets A and B. Clamping loads were 50 kg and 100 kg. The diagram in FIG. 8 illustrates the thicknesses of the layers of the high thermal conductive grease measured by a gap sensor after a clamping of each of the water-cooled jackets and the electronic device. As shown in FIG. 8, the thickness of the high thermal conductive grease applied to the grooved water-cooled jacket B is more rapidly reduced than that of the high thermal conductive grease applied to the grooveless water-cooled jacket A.

The following Table 1 shows the separating loads required when the separation tests were carried out on the water-cooled jackets A to D. Table 1 teaches that a water-cooled jacket with more multiple grooves requires less of a separating load. The layer thickness of the high thermal conductive grease does not affect this tendency.

TABLE 1

| Heat transfer surface | Thickness of grease layer | | |
|---|---|---|---|
| | 20 (μm) | 50 (μm) | 100 (μm) |
| A | 27.4 (kg) | 20.4 (kg) | 19.0 (kg) |
| B | 6.7 | 5.4 | 4.5 |
| C | 4.3 | 3.6 | 3.5 |
| D | 2.4 | 2.3 | 1.9 |

The other embodiments of the water-cooled jacket by which the pressing and separating operations are more easily carried out will be described hereinafter. A heat transfer surface of each of these embodiments of the water-cooled jacket of FIGS. 9 to 12 has multiple grooves each of which does not pass through the outer periphery of the water-cooled jacket. The center of the heat transfer surface has a hole extending through the thickness of the water-cooled jacket and communicating with all the grooves.

Figure 9:
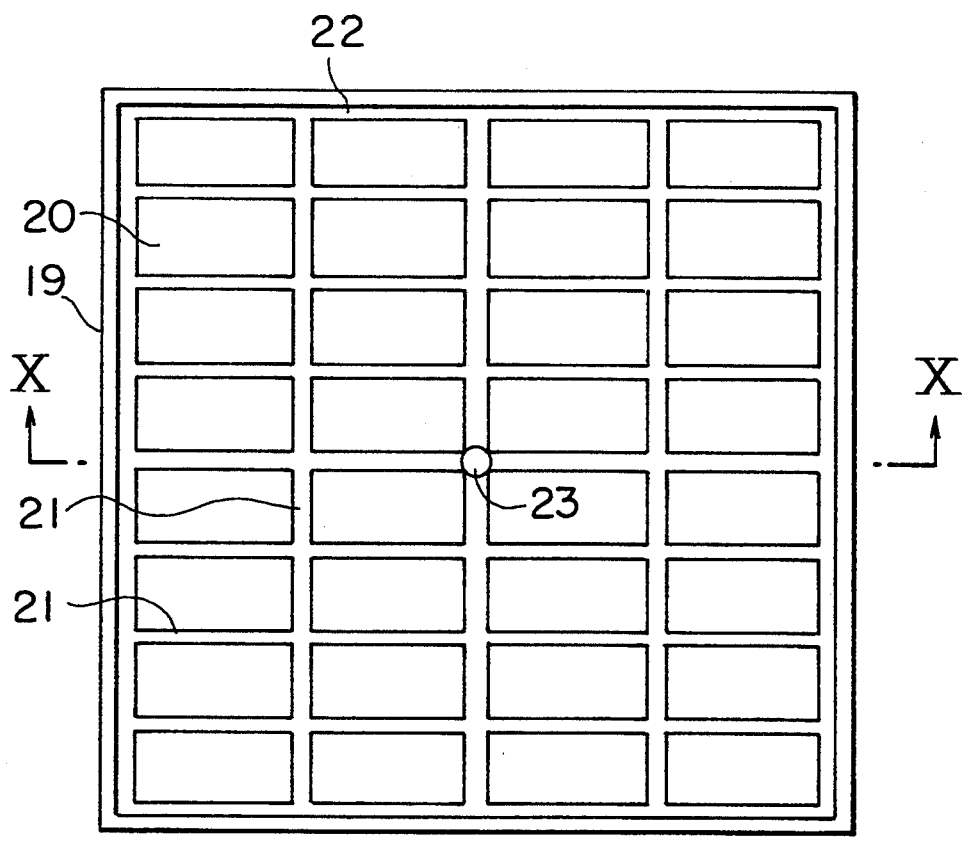
FIG. 9 is a bottom view of a further embodiment of the water-cooled jacket.
Figure 10:
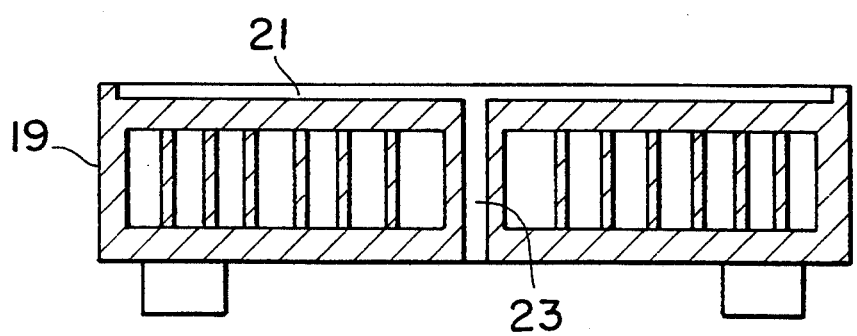
FIG. 10 is a sectional view taken along the line X—X in FIG. 9.

As shown in FIGS. 9 and 10, multiple grooves 21 arranged in the form of grid on a heat transfer surface 20 of a water-cooled jacket 19 at the central portion thereof communicate with a peripheral continuous groove 22 extending along the outer periphery of the heat transfer surface 20 so as not to pass through the outer periphery of the heat transfer surface 20. Thus, the multiple grooves 21 and the peripheral groove 22 communicate with a through-hole 23 defined at the center of the water-cooled jacket 19 and extending through the thickness of the water-cooled jacket 19. The heat transfer surface 20 with the multiple grooves 21 and 22 is in close contact with and somewhat pressed on a layer of the high thermal conductive grease, and then a vacuum pump or the like draws air out of the grooves 21 and 22 through the through-hole 23, so that a pressure differential between the outside and inside of the grooves 21 and 22 easily presses the water-coiled jacket on the electronic device. On the other hand, when the water-cooled jacket is separated from the electronic device, feeding compressed air through the through-hole 23 into the grooves 21 and 22 pressurizes the interiors of the grooves 21 and 22, so that the water-cooled jacket is readily separated from the electronic device without a need for an additional external force. In this case, the compressed air serves to separate the water-cooled jacket from the package and divide the layer of the high thermal conductive grease.

Figure 11:
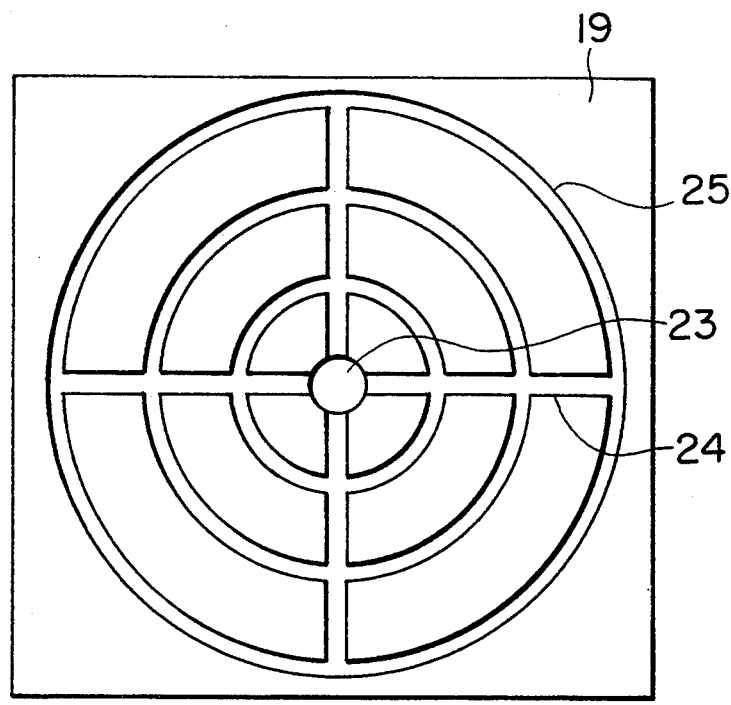
FIGS. 11 and 12 are bottom views of still further embodiments of the water-cooled jacket, respectively.
Figure 12:
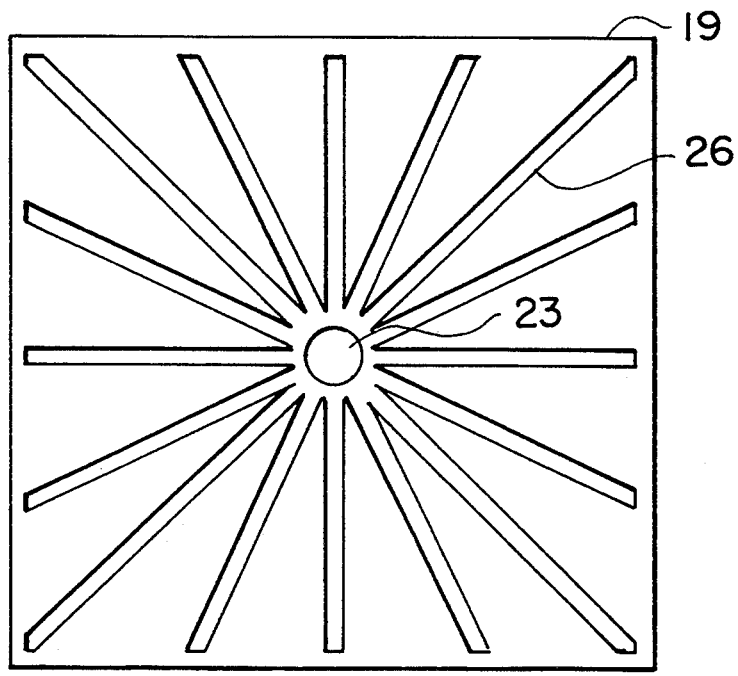

FIGS. 11 and 12 illustrate other embodiments of the water-cooled jacket similar to the embodiment of FIGS. 9 and 10. The water-cooled jacket of FIG. 11 has radially extending grooves 24 and annular concentric grooves 25 crossing the radially extending grooves 24. The water-cooled jacket of FIG. 12 has multiple radially extending grooves 26. In any above embodiments of the present invention, the water-cooled jacket has employed water as a coolant. However, the coolant may alternatively be air or the like.

Figure 13:
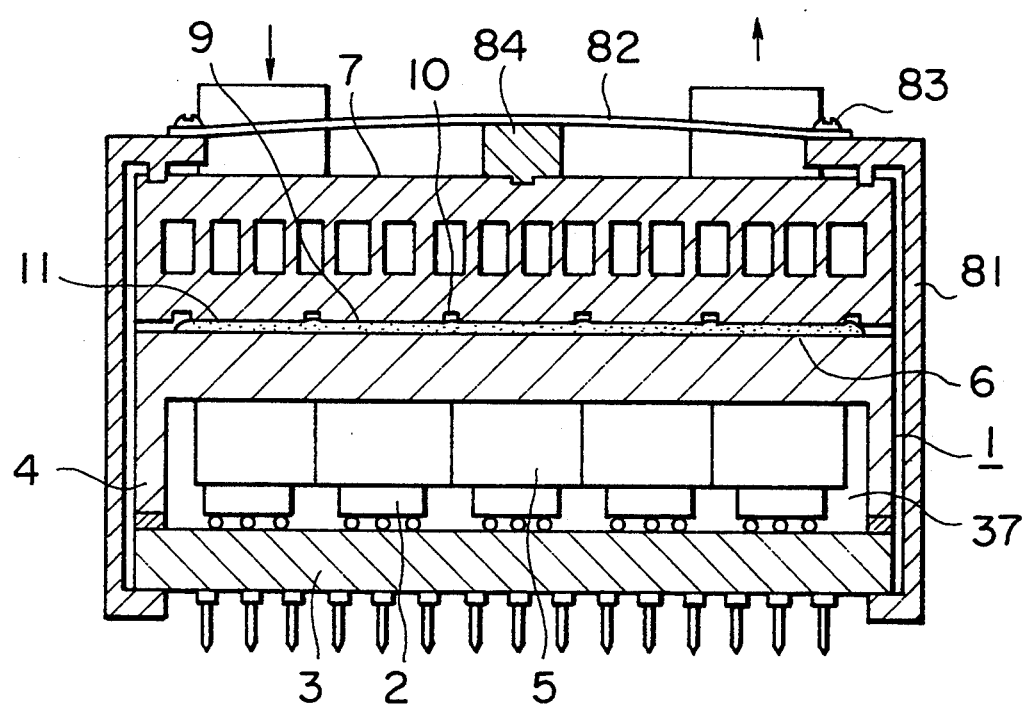
FIG. 13 is a vertical sectional view showing another embodiment of a cooling apparatus for an electronic device according to the present invention.

FIG. 13 shows another embodiment of the present invention, in which a metal clamp (pressurizing means) is composed of a clamping external frame 81, a leaf spring 82, secure threads 83 for securing this leaf spring 82 to the clamping external frame 81, and a load support means 84 for transmitting an elastic load of the leaf spring 82 to the center of the water-cooled jacket 7. With such construction of the metal clamp, even if the heat transfer surface 6 of the ceramic package 4 is deformed by heat and warped by heating the microchip carriers 2 and cooling the water-cooled jacket 7, because the water-cooled jacket 7 is always applied with a load at the center thereof by an elasticity of the leaf spring 83, the heat transfer surface 9 of the water-cooled jacket 7 can follow up the displacement by heat of the heat transfer surface 6. Thus, it is possible to stably maintain at a certain value a thickness of the layer of the high thermal conductive grease 11 sandwiched between the respective heat transfer surfaces 6 and 9. In this embodiment, the thermal conductive grease 11 is provided only on the heat transfer surface 9 of the water-cooled jacket 7 formed between the grooves 10 and is prevented from swelling out of the outer periphery of the heat transfer surface 9 of the water-cooled jacket 7. Concretely, the grease 11 is prevented from swelling out by means of the outermost grooves 10.

Other embodiments of the invention illustrated in FIGS. 14 to 20 indicate a case where grooves are provided on a heat transfer contact surface of the flexible thermal conductive contactor 5 shown in FIG. 13. Like references are appended to members like as or similar to FIGS. 1 and 2, and explanations and indications thereof are omitted.

Figure 14:
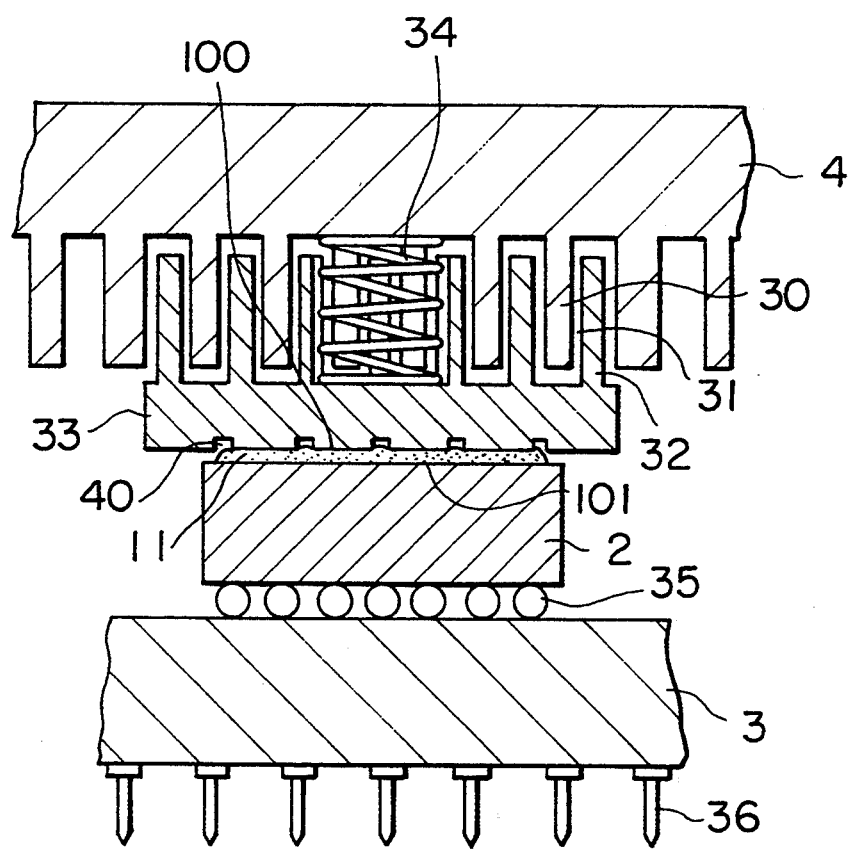
Figure 15:
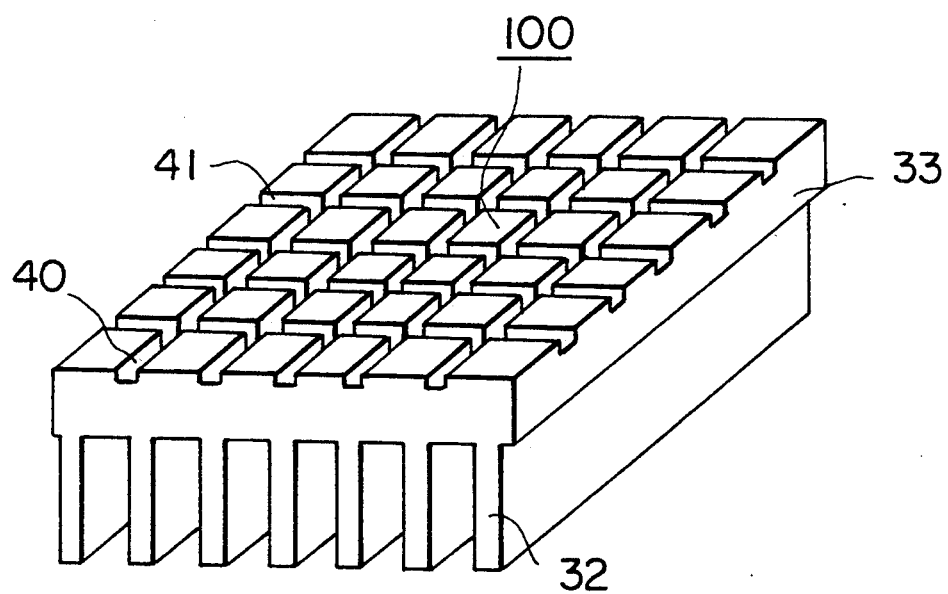
FIG. 15 is a perspective view of lower fins illustrated in FIG. 14.

Referring now to FIG. 14, the flexible thermal conductive contactor 5 comprises; a solid thermal conductor 33 having fins 32 each fitting with a number of flat fins 30 extending from an inner surface of the package 4 with microgaps 31; a spring 34 pressing a heat transfer flat surface 100 of the solid thermal conductor 33 onto a heat transfer surface 101 of the microchip carrier 2; and on the heat transfer surface 100 of the solid thermal conductor 33, a number of grooves 40 each communicating with the outside of the heat transfer surface 100. As shown in FIG. 15, the grooves 40 are perpendicular to grooves 41 on the heat transfer surface 100, respectively. These grooves 40 and 41 are formed so as to exist inside the outer periphery of the heat transfer surface 101 of the microchip carrier 2. The capacity of the grooves 40 and 41 are arranged to be larger than the volume of the high thermal conductive grease 11 surrounded by the grooves and applied between the two heat transfer surfaces 100 and 101.

With such construction, the solid thermal conductor 33 are able to be brought into close contact with the microchip carrier 2 through the usually stable and thin high thermal conductive grease layer 11, thereby cooling the heat produced by the microchip carrier 2 efficiently. Further, during assembly and disassembly of the solid thermal conductor 33, the soldering microballs 35 are not damaged.

Figure 16:
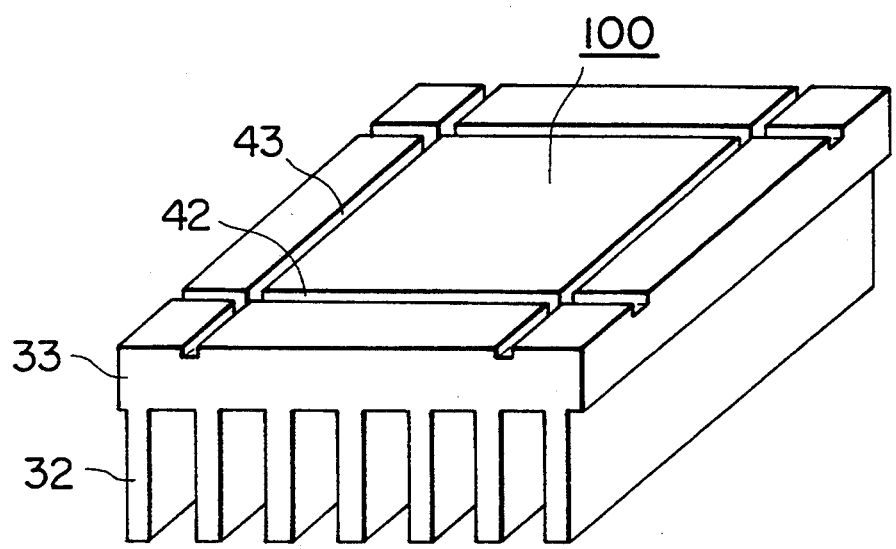
FIG. 16 is a perspective view of another instance of the lower fins illustrated in FIG. 14.

In FIG. 16, the heat transfer surface 100 of the solid thermal conductor 33 is provided with two pairs of grooves 42 and 43, one pair extending traversely and the other pair extending longitudinally on the heat transfer surface. These grooves 42 and 43 are provided slightly inwardly apart from the outermost periphery of the heat transfer surface 101 of the microchip carrier 2. Similarly to the outermost peripheral grooves of FIG. 15, the grooves 42 and 43 also operates to prevent the sandwiched thermal conductive grease 11 from swelling to the outside of the contact surfaces.

FIG. 17 illustrates a modification of the embodiment which has been seen in FIG. 14. In this modification, the high thermal conductive grease 11 is further provided in the microgaps 31, differently from the embodiment of FIG. 14. In accordance with this modification, since heat produced by the microchip carrier 2 can be transmitted efficiently without being affected by the surrounding gas or the like, the package 4 is not required to hermetically seal and package the interconnection substrate 3 so that it becomes easy to assemble the cooling device.

In the embodiments illustrated in FIGS. 14 to 17, the solid thermal conductor 33 has the grooves. However, the microchip carrier 2 may alternatively have the grooves. A high thermal conductive adhesive also produces an operation and effect similar to the high thermal conductive grease.

Figure 18:
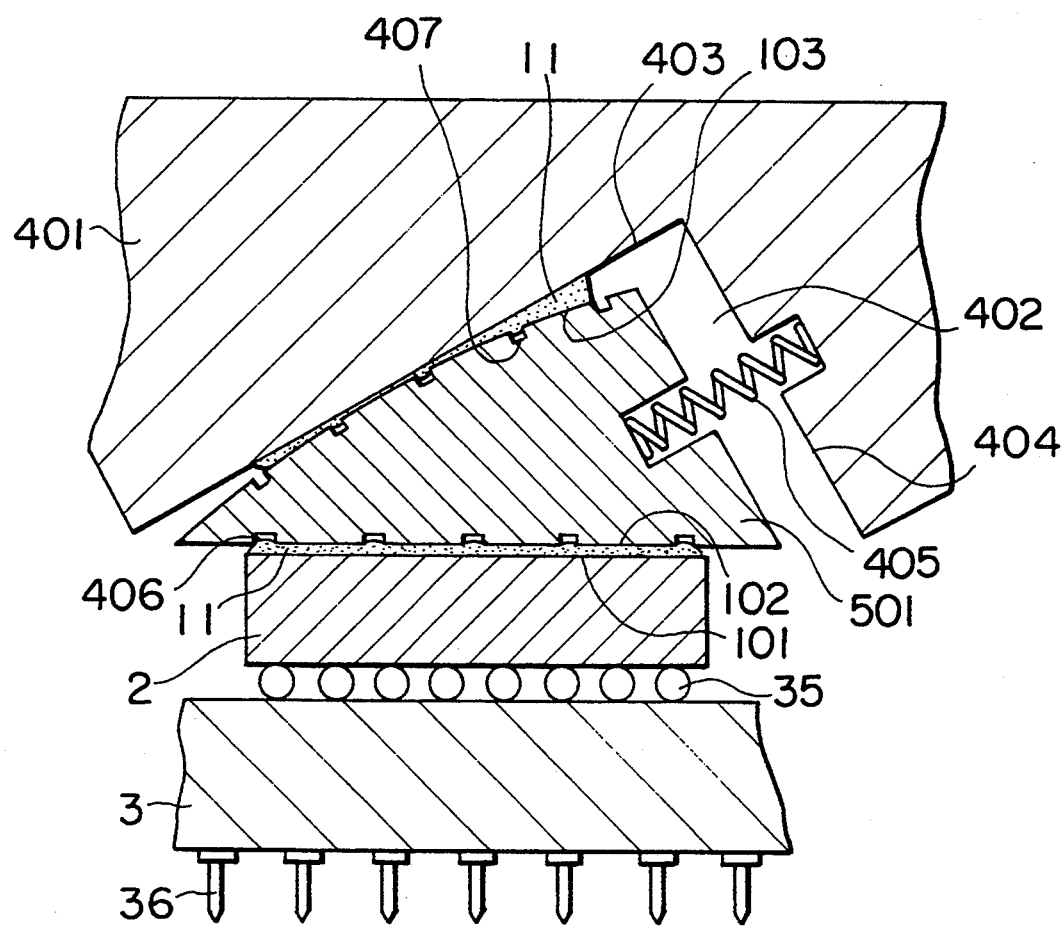
Figure 19:
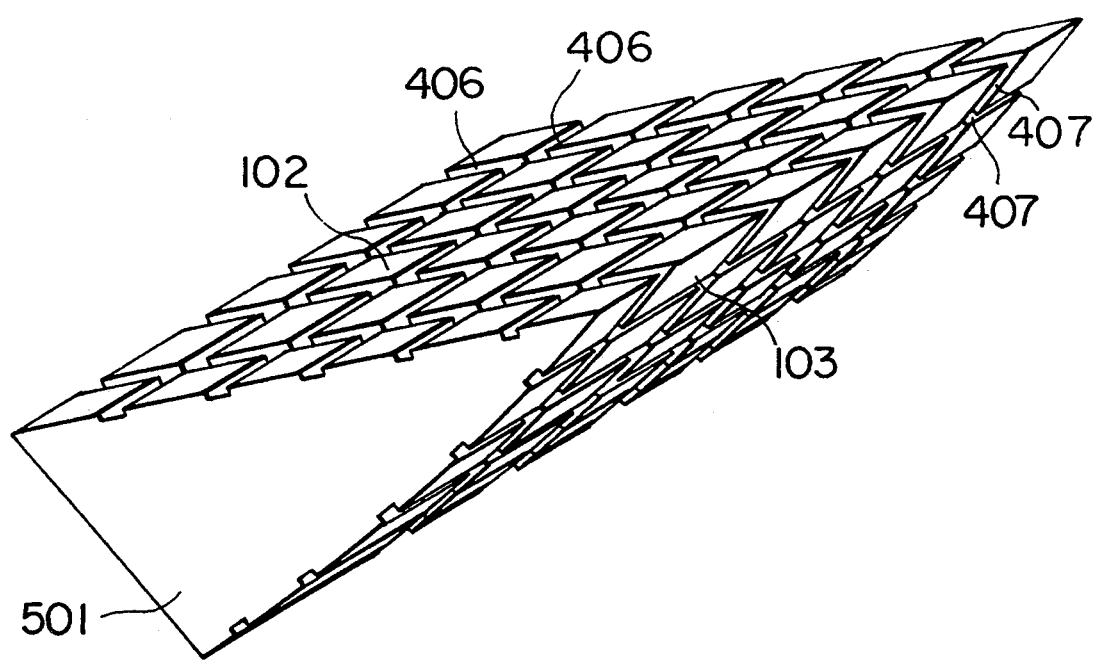
FIG. 19 is a perspective view of a flexible thermal conductive contactor shown in FIG. 18.

Still another embodiment will be described below with reference to FIGS. 18 to 20.

A package 401 is provided with a number of V-shaped grooves 402 on its inner surface in the vertical direction with respect to the drawing. A solid thermal conductor 501 which is a triangular flexible thermal conductive contactor, is disposed between the microchip carrier 2 and each V-shaped groove 402. The triangular thermal conductor 501 has such surfaces; a surface 102 in contact with the microchip carrier 2 being flat, a surface in contact with one surface 403 of the V-shaped groove 402 being circular, and a surface opposing to the other surface 404 of the V-shaped groove being flat. A spring 405 is provided for applying contact pressure with respect to the solid thermal conductor 501. Further, the surfaces 102 and 103 of the triangular thermal conductor are provided with grooves 406 and 407 crossing at right angles with one another, respectively. The high thermal conductive grease 11 is sandwiched between the flat surface 403 of the V-shaped groove 402 and the circular surface 103, and between a heat transfer surface 101 of the microchip carrier 2 and the contact surface 102 of the solid thermal conductor 501, respectively. Even when the microchip carrier 2 is actually mounted with being inclined with respect to the interconnection substrate 3, because one surface 103 of the solid thermal conductor 501 is circular, the circular surface 103 of the solid thermal conductor 501 and the V-groove surface 403 slips on each other so that they can always linearly be in contact with each other. In the above state, if the thermal conductive grease is sandwiched, the thermal conductive grease is always formed into a thin layer by the above-mentioned function and effect of the grooves.

Figure 20:
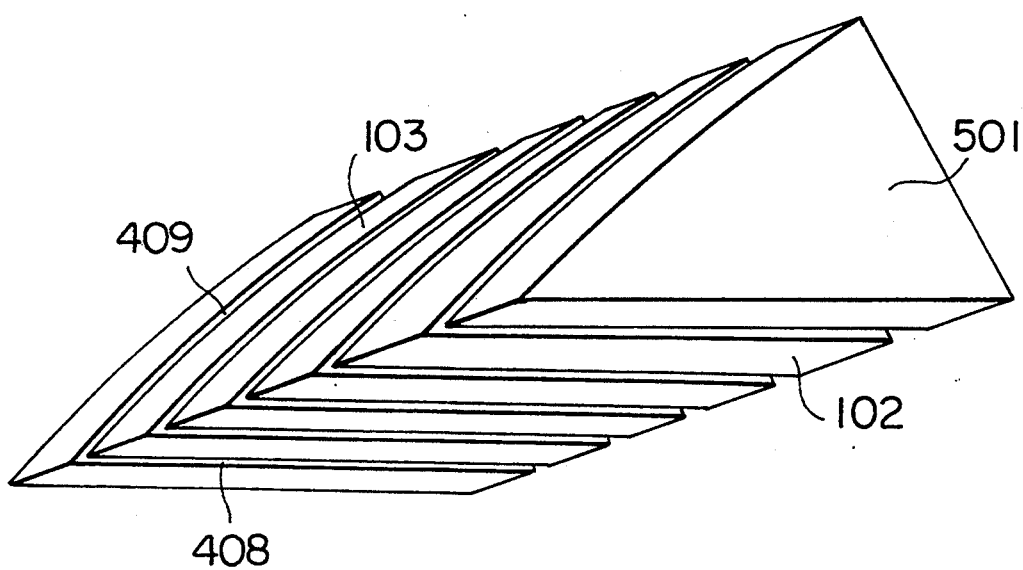
FIG. 20 is a perspective view of another instance of the flexible thermal conductive contactor illustrated in FIG. 19.

FIG. 20 shows a modified embodiment of the grooves formed on the surfaces of the thermal conductor 501. The surfaces are provided with parallel grooves 408 and 409, respectively. Other points are the same as the embodiment shown in FIGS. 18 and 19.

In accordance with the present invention, when a cooling solid body is pressed through a layer of a high thermal conductive liquid which is hard to wet and spread over the surface of a solid on an electronic device e.g. an LSI chip itself, micro-chip carrier containing an LSI chip or multichip module containing the LSI chip and microchip carrier, so as to cool the electronic device, a small force can cause the cooling solid body to be in close contact with the electronic device and the cooling solid body can be always stably pressed on the electronic device by a pressing force of the spring even if the heat transfer surface is displaced by heat. Thus, the electronic device and a connection to the electronic device will not experience damage, and a contact heat resistance between the cooling solid body and electronic device can be maintained low and stable. On the other hand, a small force can separate the cooling solid body from the electronic device, so that the electronic device will experience neither a damage nor deformation. A simplified arrangement of assembly and disassembly produces advantages in that a cost is reduced and a working efficiency is improved.

Further, according to the present invention, it is possible to prevent the high thermal conductive fluid from swelling to the outside of the contact surfaces between which the fluid is sandwiched, and to prevent the high thermal conductive fluid from unnecessarily adhering.

What is claimed is:

1. A cooling apparatus for an electronic device, comprising:
    an electronic device;
    a cooling solid body for eliminating heat produced by said electronic device;
    a highly viscous fluid layer containing thermal conductive powder having a high thermal conductivity sandwiched between a heat transfer surface of said electronic device and a heat transfer surface of said cooling solid body;
    pressurizing means for forcing said cooling solid body into close contact with said electronic device; and
    multiple grooves which are formed on one of the heat transfer surface of said electronic device and the heat transfer surface of said cooling solid body and which are communicated with space surrounding one of said electronic device and said cooling solid body having the heat transfer surface, said pressurizing means comprising an elastic member for pressing said cooling solid body on said electronic device and for pressing the highly viscous fluid layer constantly to keep the fluid layer as a thin layer.

2. A cooling apparatus for an electronic device as recited in claim 1, wherein the highly viscous fluid layer comprises a fluid which is hard to wet and spread over the surface of a solid.

3. A cooling apparatus for an electronic device as recited in claim 2, wherein the highly viscous fluid layer comprises grease or a thermal conductive adhesive.

4. A cooling apparatus for an electronic device as recited in claim 3, wherein the highly viscous fluid layer comprises a high viscous grease.

5. A cooling apparatus for an electronic device as recited in claim 1, wherein the capacity of the grooves is larger than the volume of the highly viscous fluid layer sandwiched between said electronic device and said cooling solid body between adjacent ones of the grooves so that space is left in each of the grooves when some of the highly viscous fluid layer between the adjacent ones of the grooves enters the adjacent ones of the grooves.

6. A cooling apparatus for an electronic device with a heat transfer surface, comprising a cooling solid body, a spring which forces the cooling solid body into close contact with the heat transfer surface of the electronic device to which surface is applied a highly viscous fluid layer containing thermal conductive powder with high thermal conductivity hardly wetting body, and said spring presses the highly viscous fluid layer constantly to keep the fluid layer as a thin layer, wherein one of a heat transfer surface of the electronic device and the heat transfer surface of the cooling solid body is flat, the other heat transfer surface is a grooved surface including flat heat transfer surface portions and multiple grooves defined between the flat heat transfer surface portions and communicates with an outside of one of said electronic device and said cooling solid body having the grooved heat transfer surface, and the capacity of each of the grooves is larger than the volume of a portion of the highly viscous fluid layer applied to a corresponding flat heat transfer surface portion between adjacent ones of the grooves.

7. A cooling apparatus for an electronic device as recited in claim 6, wherein the section of each of the grooves tapers from the open end of the groove provided at a corresponding heat transfer surface portion of the cooling solid body to the narrow bottom of the groove.

8. A cooling apparatus for an electronic device as recited in claim 6, wherein all the grooves communicate with one another.

9. A cooling apparatus for an electronic device as recited in claim 8, wherein the cooling solid body includes a through-hole extending from the heat transfer surface to the opposite surface of the cooling solid body, each of the grooves communicates with the through-hole so as to open to the outside of the cooling solid body and communicates with space surrounding said cooling solid body.

10. A cooling apparatus for an electronic device as recited in claim 6, the electronic device comprises a multichip module with a high thermal conductive ceramic package.

11. A cooling apparatus for an electronic device, comprising a cooling solid body in close contact through a highly viscous fluid layer containing thermal conductive powder and having a high thermal conductivity with a heat transfer surface of the electronic device, and multiple grooves which are formed on one of the heat transfer surface of said electronic device and the heat transfer surface of said cooling solid body and which are communicated with the outside of the heat transfer surface, the capacity of said grooves is greater than the volume of the highly viscous fluid layer sandwiched between said heat transfer surfaces, and each of the grooves leaves therein space communicating with an outside of the heat transfer surface when the highly viscous fluid layer is received within said grooves, and an elastic member is provided for pressing to force said cooling solid body into close contact with the electronic device and for pressing the highly viscous fluid layer constantly to keep the fluid layer as a thin layer.

12. A cooling apparatus for an electronic device as recited in claim 11, wherein said elastic member is a leaf spring, by which said cooling solid body is pressed onto the electronic device at the center thereof.

13. A cooling apparatus for an electronic device, comprising:
an electronic device to be cooled;
highly viscous fluid layer containing thermal conductive powder provided on a heat transfer portion of said electronic device;
a cooling solid body in close contact through said highly viscous fluid layer with the heat transfer portion of said electronic device, the close contact portion of said cooling solid body having multiple grooves open to the outside of said cooling solid body; and
a spring member for pressing said cooling solid body on said electronic device and for pressing the highly viscous fluid layer constantly to keep the fluid layer as a thin layer.

14. A cooling apparatus for an electronic device as recited in claim 13, wherein said spring member is a leaf spring and the apparatus includes a load support means for transmitting an elastic load of the leaf spring to the center of said cooling solid body.

15. A cooling apparatus for an electronic device, comprising:
an electronic device of which a package contains at least one semiconductor chip;
a cooling solid body for eliminating heat produced by said electronic device;
highly viscous fluid layer containing thermal conductive powder with high thermal conductivity sandwiched between an overall heat transfer surface of said electronic device and a heat transfer surface of said cooling solid body; and
spring means for providing an elastically pressing to force said cooling solid body into close contact with said electronic device and for pressing the fluid layer constantly so as to keep the fluid layer as a thin layer.

16. A cooling apparatus for an electronic device, comprising:
a multichip module in which a ceramic package hermetically seals a ceramic multilayer interconnection substrate with multiple LSI chips packaged thereon and flexible thermal conductive contactors transmit heat produced by said LSI chips to the ceramic package;
a water-cooled jacket in close contact through highly viscous fluid layer containing thermal conductive powder and having high thermal conductivity and viscosity with the overall surface of a heat transfer portion of the multichip module, water passing through the interior of the water-cooled jacket; and
means for providing an elastically pressing to force the water-cooled jacket into close contact with the multichip module in order to press said highly viscous fluid layer between the water-cooled jacket and the multichip module constantly to keep the fluid layer as a thin layer.

17. A cooling apparatus for an electronic device as recited in claim 16, wherein said elastically pressing means is a leaf spring, and the apparatus has an arrangement in which an elastic load of said leaf spring is transmitted to the center of said water-cooled jacket through a load support means.

18. A cooling apparatus for an electronic device, comprising a multichip module package made of a high thermal conductive material to seal a ceramic multilayer interconnection substrate with multiple LSI chips packaged thereon and flexible thermal conductive contactors to transmit heat produced by said LSI chips to said package; multiple grooves provided on at least one of contact surfaces between heat transfer surfaces of said LSI chips and heat transfer surfaces of said flexible thermal conductive contactors; a highly viscous fluid layer containing thermal conductive powder sandwiched between said contact surfaces; and an elastic member operatively arranged for forcing said flexible thermal conductive contactors into close contact with the heat transfer surfaces of said LSI chips and for pressing said highly viscous fluid layer constantly to keep the fluid layer as a thin layer.

19. A cooling apparatus for an electronic device, as recited in claim 18, wherein said flexible conductive contactors include fins fitting with a number of flat fins extending from an inner surface of said package with microgaps, and said highly viscous mixture is also sandwiched between adjacent ones of said fins.

20. A cooling apparatus for an electronic device, as recited in claim 19, wherein each of said thermal conductors including the fins is formed with said multiple grooves on its surface in contact with said LSI chips.

21. A cooling apparatus for an electronic device, as recited in claim 18, wherein each of said flexible thermal conductive contactors is a triangular thermal conductor having a circular surface in contact with a corresponding V-shaped groove formed in an inner surface of said package and a flat surface in contact with the LSI chips, a number of grooves communicating with the outside are provided on said circular and flat surfaces of said thermal conductor, and highly viscous mixture is sandwiched between said circular surface and the package.

22. A cooling apparatus for an electronic device, comprising a multichip module package made of a high thermal conductive material to seal a ceramic multilayer interconnection substrate with multiple microchip carriers containing LSI chips packaged thereon and flexible thermal conductive contactors to transmit heat produced by said LSI chips to said package; multiple grooves provided on one of contact surfaces between heat transfer surface of said microchip carriers and said flexible thermal conductive contactors; a highly viscous fluid layer containing thermal conductive powder sandwiched between the two contact surfaces; and an elastic member operatively arranged for forcing said flexible thermal conductive contactors into close contact with the heat transfer surface of said microchip carriers and for pressing said highly viscous fluid layer constantly to keep the fluid layer as a thin layer.

23. A cooling apparatus for an electronic device, as recited in claim 22, wherein said flexible thermal conductive contactors are thermal conductors including flat fins fitting with a number of flat fins extending from an inner surface of said package with microgaps, and said thermal conductors are provided with said multiple grooves on its surface in contact with the microchip carriers.

24. A cooling apparatus for an electronic device as recited in claim 8, wherein said transfer surface defines grid-shaped grooves so as to make the grooves communicate with each other.

25. A cooling apparatus for an electronic device as recited in claim 24, wherein the cooling solid body includes a through-hole extending from the heat transfer surface to the opposite surface of the cooling solid body, each of the grooves communicates with the through-hole so as to open to the outside of the cooling solid body and communicate with space surrounding said cooling solid body.

26. A cooling apparatus for an electronic device as recited in claim 8, wherein said transfer surface defines radially extending grooves and annular concentric grooves crossing said radially extending grooves so to make the grooves communicate with each other.

27. A cooling apparatus for an electronic device as recited in claim 26, wherein the cooling solid body includes a through-hole extending from the heat transfer surface to the opposite surface of the cooling solid body, each of the grooves communicates with the through-hole so as to open to the outside of the cooling solid body and communicate with space surrounding said cooling solid body.

28. A cooling apparatus for an electronic device as recited in claim 8, wherein said transfer surface defines multiple radially extending grooves so as to make the grooves communicate with each other.

29. A cooling apparatus for an electronic device as recited in claim 28, wherein the cooling solid body includes a through-hole extending from the heat transfer surface to the opposite surface of the cooling solid body, each of the grooves communicates with the through-hole so as to open to the outside of the cooling solid body and communicate with space surrounding said cooling solid body.

30. The cooling apparatus according to claim 1, wherein the thermal conductive powder constitutes fine particles of zinc oxide.

31. The cooling apparatus according to claim 1, wherein the thermal conductive powder constitutes fine particles of ceramic.

32. The cooling apparatus according to claim 6, wherein the thermal conductive powder constitutes fine particles of zinc oxide.

33. The cooling apparatus according to claim 6, wherein the thermal conductive powder constitutes fine particles of ceramic.

34. The cooling apparatus according to claim 11, wherein the thermal conductive powder constitutes fine particles of zinc oxide.

35. The cooling apparatus according to claim 11, wherein the thermal conductive powder constitutes fine particles of ceramic.

36. The cooling apparatus according to claim 13, wherein the thermal conductive powder constitutes fine particles of zinc oxide.

37. The cooling apparatus according to claim 13, wherein the thermal conductive powder constitutes fine particles of ceramic.

38. The cooling apparatus according to claim 15, wherein the thermal conductive powder constitutes fine particles of zinc oxide.

39. The cooling apparatus according to claim 15, wherein the thermal conductive powder constitutes fine particles of ceramic.

40. The cooling apparatus according to claim 16, wherein the thermal conductive powder constitutes fine particles of zinc oxide.

41. The cooling apparatus according to claim 16, wherein the thermal conductive powder constitutes fine particles of ceramic.

42. The cooling apparatus according to claim 18, wherein the thermal conductive powder constitutes fine particles of zinc oxide.

43. The cooling apparatus according to claim 18, wherein the thermal conductive powder constitutes fine particles of ceramic.

44. The cooling apparatus according to claim 22, wherein the thermal conductive powder constitutes fine particles of zinc oxide.

45. The cooling apparatus according to claim 22, wherein the thermal conductive powder constitutes fine particles of ceramic.

* * * * *